United States Patent [19]

Nagamatsu

[11] Patent Number: 5,171,701
[45] Date of Patent: Dec. 15, 1992

[54] METHOD OF MANUFACTURING MASTER-SLICE SEMICONDUCTOR INTEGRATED CIRCUITS

[75] Inventor: Masato Nagamatsu, Kawasaki, Japan

[73] Assignee: Kabushiki Kaisha Toshiba, Kawasaki, Japan

[21] Appl. No.: 729,128

[22] Filed: Jul. 12, 1991

[30] Foreign Application Priority Data

Jul. 16, 1990 [JP] Japan .................. 2-187751

[51] Int. Cl.⁵ .................. H01L 21/70; H01L 27/00
[52] U.S. Cl. .................. 437/51; 437/34; 437/40; 437/52; 357/45; 357/50
[58] Field of Search .................. 437/51, 34, 52, 40; 357/45, 51, 40, 42

[56] References Cited

U.S. PATENT DOCUMENTS

| | | | |
|---|---|---|---|
| 4,388,755 | 6/1983 | Enomoto et al. | 437/51 |
| 4,633,571 | 1/1987 | Kolwicz | 437/34 |
| 4,682,202 | 7/1987 | Tanizawa | 357/43 |
| 4,742,383 | 5/1988 | Fitzgerald | 357/45 |
| 4,780,846 | 10/1988 | Tanabe et al. | 357/45 |
| 4,791,474 | 12/1988 | Sugiura et al. | 357/45 |
| 4,980,745 | 12/1990 | Muroga | 357/42 |

*Primary Examiner*—Brian E. Hearn
*Assistant Examiner*—Kevin M. Picardat
*Attorney, Agent, or Firm*—Finnegan, Henderson, Farabow, Garrett and Dunner

[57] ABSTRACT

A method for forming in a short time master-slice integrated circuits of high reliability, which circuits comprise diffusion layers and polysilicon layers which form transistor elements, and a plurality of metal wiring layers formed for realizing desired circuits, with insulating layers interposed between every adjacent two of the wiring layers. The methods comprises a first wiring process in which a master slice is provided by forming a predetermined number of metal layers in a wafer, and a second wiring process in which further metal wiring layers, to be customized so as to have logical functions required by a user, are formed on the first-mentioned metal wiring layers. The inner-most metal wiring layer of all the metal layers is used as wide power source line which is almost free from electro or stress migration.

11 Claims, 3 Drawing Sheets

METHOD OF MANUFACTURING MASTER-SLICE SEMICONDUCTOR INTEGRATED CIRCUITS

BACKGROUND OF THE INVENTION

1. Field of the Invention

This invention relates to a method of manufacturing improved master-slice LSIs which require a reliable fine-wiring process.

2. Description of the Related Art

Master-slice integrated circuits (master-slice LSIs) are suitable for manufacturing IC devices of a small number and various kinds, such as analog and digital ICs. This "master-slice" means a wafer in which many kinds of ICs are preformed, i.e., a plurality of transistor elements and the like are preformed. In a master slice, nodes (which correspond to e.g. a source, a drain, and a gate of a MOS transistor) of each transistor are independent from each other, i.e., not connected to each other. Desired circuit wiring including wiring between such nodes is performed in a later process for forming metal layers. This wiring process is called "customizing process", in which circuits having various functions required by the user are formed.

In recent years, the following problems have occurred in accordance with development of LSI fine processing and with increase in the application of the technique:

First, a decrease in the reliability of IC devices has occurred in accordance with the development of refining technique of metal wiring layers In particular, electro or stress migration has become remarkable in a metal layer made of an aluminum alloy, which may cause a breakage in the layer. To avoid the breakage, it is considered to enlarge or thicken the minimum dimension of the metal layer. This, however, is unfavorable since it prevents refinement of LSIs.

Second, it is difficult to form high density devices such as a ROM (Read Only Memory), a RAM (Random Access Memory) etc.

In master-slice LSIs each having a gate array and a SRAM (Static RAM), or a gate array and a DRAM (Dynamic RAM), a base block for a logic gate and a base block for a memory are provided separately. Since a memory and a desired logical circuit are formed at the time of customization, large wiring regions are necessary, and also lots of time is required for designing the master slice.

Further, in general, considering the structure of a memory, the memory is formed inevitably in a limited manner if it is provided in the vicinity of a sense amplifier, etc. Also, the pattern of the wiring of the memory base block is simple, and it does not require such a high degree of freedom as the wiring pattern of the gate array base block. Thus, it is considered advantageous in the reliability of wiring and the designing efficiency thereof that wiring is performed for the memory portion in the stage of forming the master slice.

As is described above, in the conventional master slice, it is difficult to realize elements required in accordance with the development of the LSI refining process and with an increase in practical application, i.e., elements of high density which can have metal wiring layers of high reliability formed in a later wiring process.

SUMMARY OF THE INVENTION

It is the object of the invention to provide a method of manufacturing master-slice semiconductor integrated circuits having reinforced wiring layers and being able to be customized with ease.

In the master-slice semiconductor integrated circuits for performing desired circuits, diffusion and polysilicon layers and gate electrodes, which form transistor elements, are preformed in and on a semiconductor and a plurality of metal wiring layers and insulating layers interposed between every adjacent two of the metal wiring layers are also preformed on the semiconductor wafer, the method comprises:

a first wiring process of providing a master slice by forming a predetermined number of metal wiring layers on the wafer; and a second wiring process of forming the other metal wiring layers above the predetermined number of the metal wiring layers, the other metal wiring layers being to be customized for obtaining logical functions required by a user.

The invention is characterized in that a master slice is made by forming a predetermined number N (M > N) of metal wiring layers in a wafer in which various kinds of circuits are to be formed, and then those remaining metal layers M−N of all metal wiring layers M (M > 2) which are to be customized in a later process are formed on the N metal wiring layers. The inner-metal wiring layer is used as power source line. The power source line of a uniform width is provided around a transistor element, thereby preventing the power source line from being broken due to electro or stress migration. Thus, reliable customizing can be performed in a short time. Moreover, in master-slice LSIs incorporating a memory, the wiring of the memory and its peripheral circuit which are not to be largely changed is preformed by means of the N metal wiring layers, thus reducing the required designing or customizing time and enhancing the reliability of the wiring.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The invention will be explained with reference to the accompanying drawings showing embodiments thereof.

Figure 1:
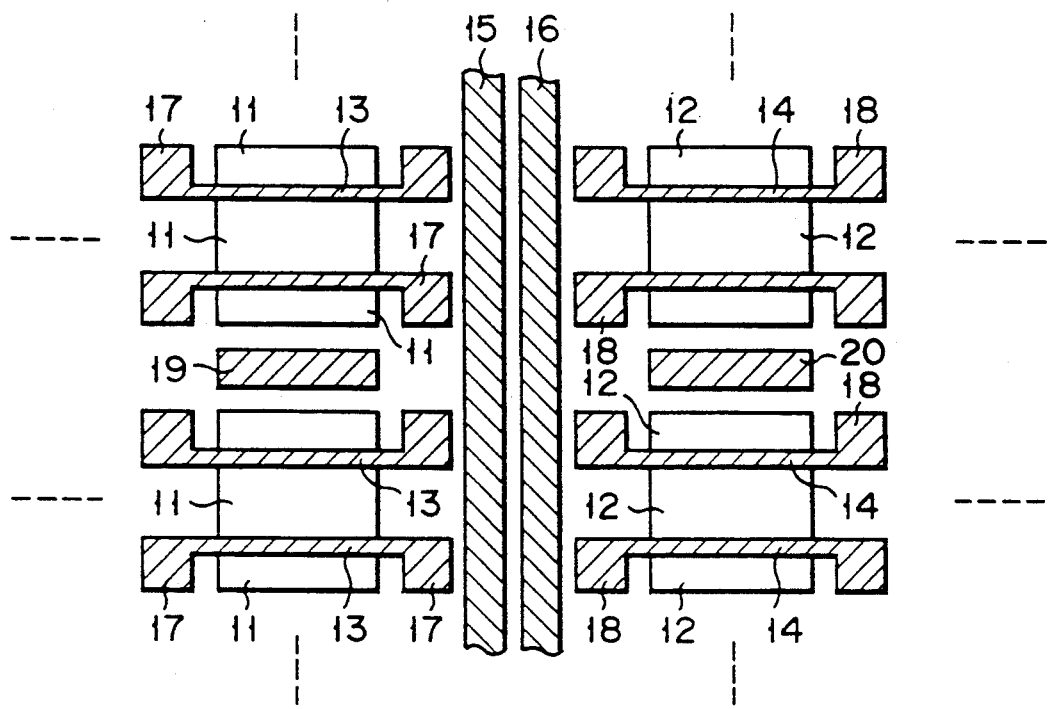
FIG. 1 is a pattern plan view showing a first embodiment of the invention.

FIG. 1 is a pattern plan view of a wafer or so-called a LSI master-slice in which lots of LSI to be later customized are preformed.

Polysilicon gates 13 and 14 are provided on P-type diffusion regions 11 and N-type diffusion regions 12 formed by implanting impurity in the surface portion of a silicon semiconductor substrate, thus arranging a gate array in a state before wiring is performed. Then, metal wiring layers 15 and 16 are formed between the different diffusion regions 11 and 12, thereby forming a master slice. Gate electrodes 17 are formed on the both opposite ends of each of the polysilicon gates 13, while gate electrodes 18 are formed on the both opposite ends of each of the polysilicon gates 14. Substrate electrodes 19 and 20 are provided between the P-type transistors and between the N-type transistors, respectively.

In many custom LSIs, a dedicated metal wiring layer is provided in customizing process, for reinforcing a power source line in which electro or stress migration will easily occur. On the other hand, in the present invention, such a reinforcing layer is formed in the master slice beforehand, together with transistors. Specifically, the metal layers 15 and 16 are used as power source lines, i.e., they serve as reinforcing layers for the power source wiring, thereby strengthening the resistance against migration, as well as enhancing the reliability of the device. This being so, circuits can be designed in the master slice unrestrictedly. By virtue of the master slice thus constructed, so-called turn around time (TAT), which means the term from the user's request to the completion of an LSI, can be shortened.

Figure 2:
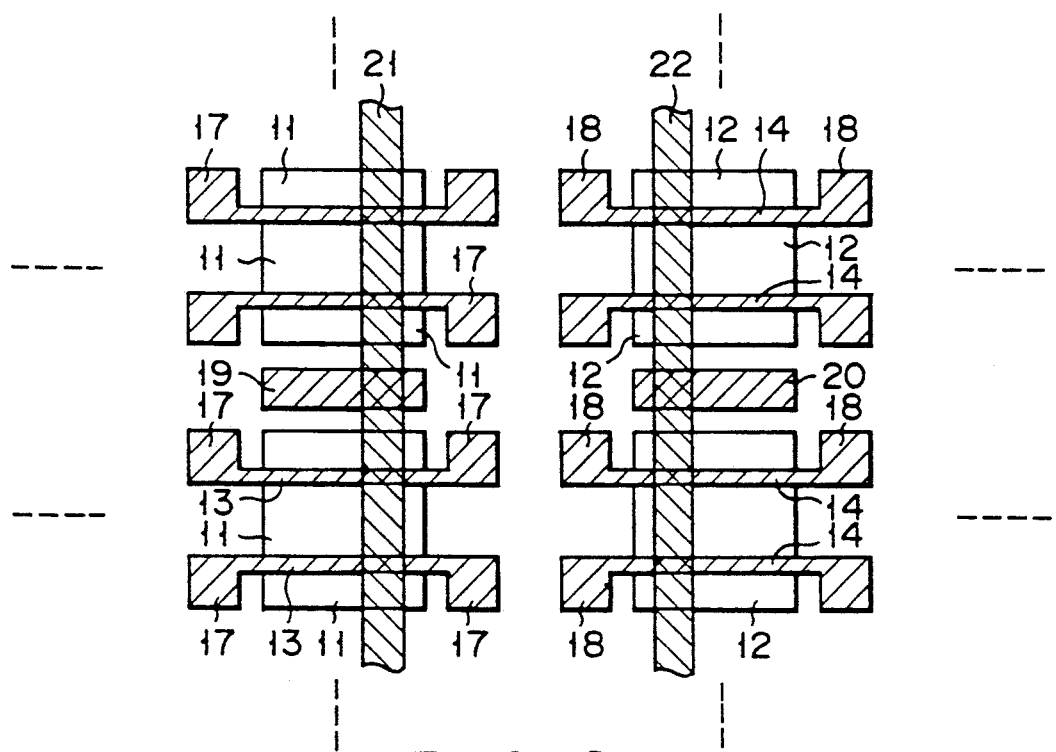
FIG. 2 is a pattern plan view showing a second embodiment of the invention.

FIG. 2 shows a second embodiment of the master slice.

In this embodiment, in place of the metal wiring layers 15 and 16, metal wiring layers 21 and 22 are provided above the transistor pattern, with interlayer insulating films (not shown) interposed. By virtue of this structure, the master slice of the second embodiment can have elements of a density higher than the master slice of FIG. 1.

Figure 3:
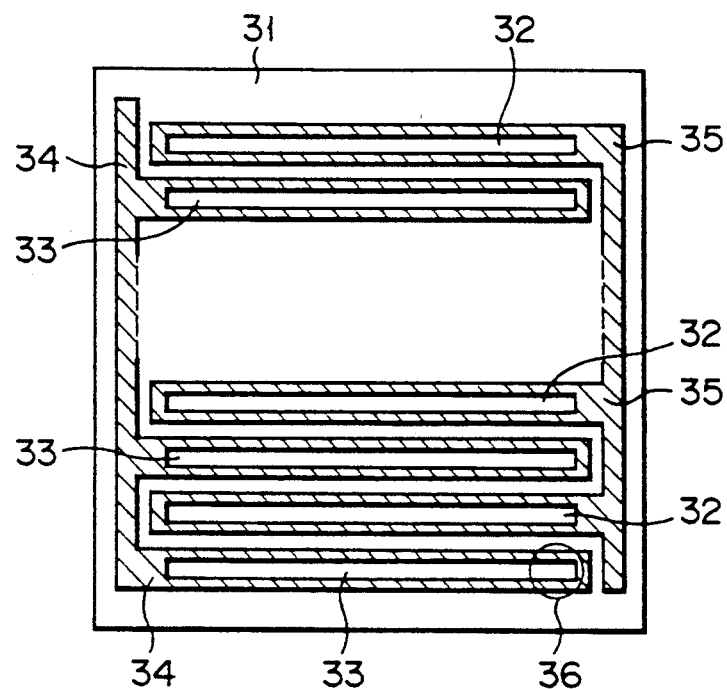
FIG. 3 is a pattern plan view showing a third embodiment of the invention.

FIG. 3 shows a third embodiment of the master slice.

Metal layers 34 and 35 for reinforcing a power source line are coated on a substrate 31 around transistors 32 and 33, thereby completing the master slice.

Figure 4:
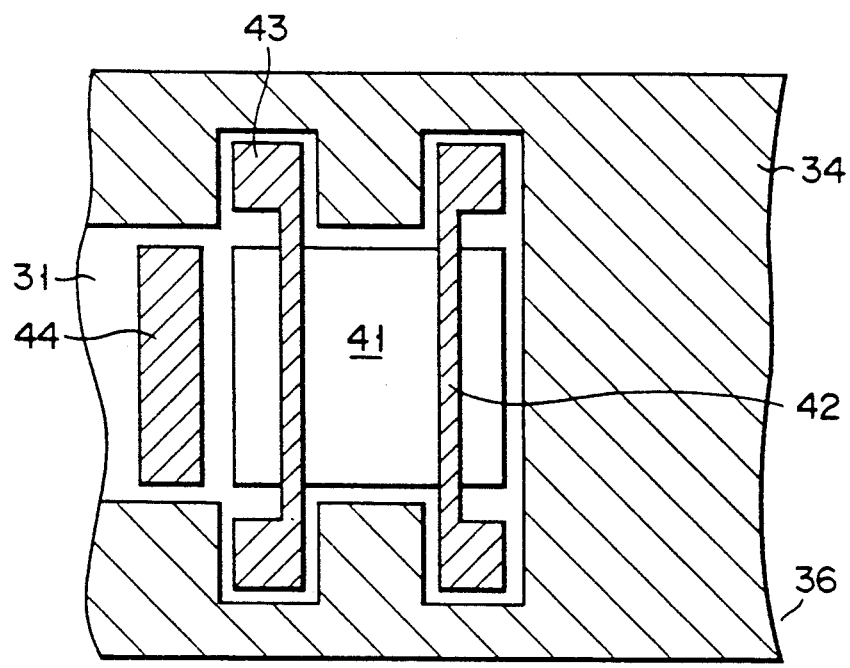
FIG. 4 is an enlarged view showing a part of the pattern shown in FIG. 3.

FIG. 4 is an enlarged view of a portion 36 shown in FIG. 3. For example, a gate 42 and a gate electrode 43 are formed across an impurity diffusion region 41 of a MOS transistor, and a substrate electrode 44 is formed in the vicinity of the region 41. A metal wiring layer 34 for reinforcing a power source line is patterned as the first wiring layer around the elements 42 – 44.

Figure 5:
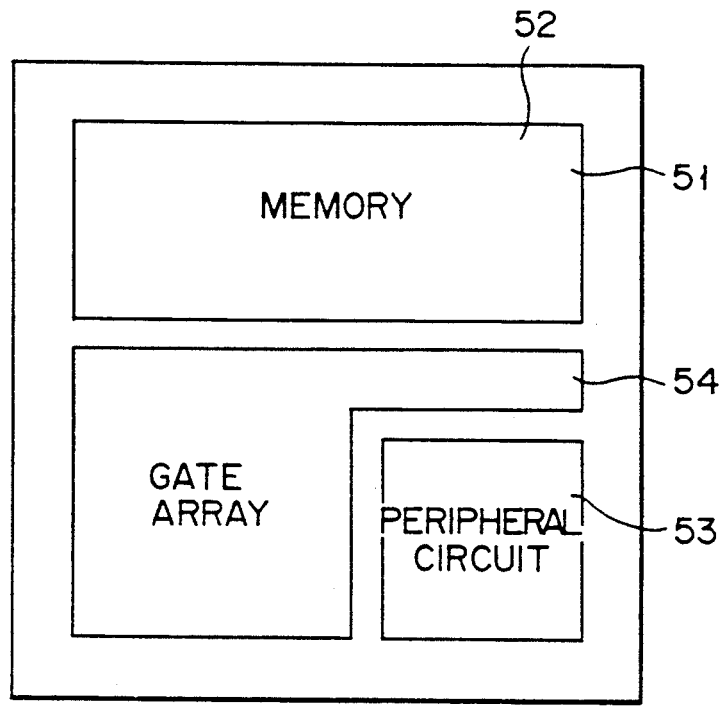
FIG. 5 is a pattern plan view showing a fourth embodiment of the invention.
Figure 6:
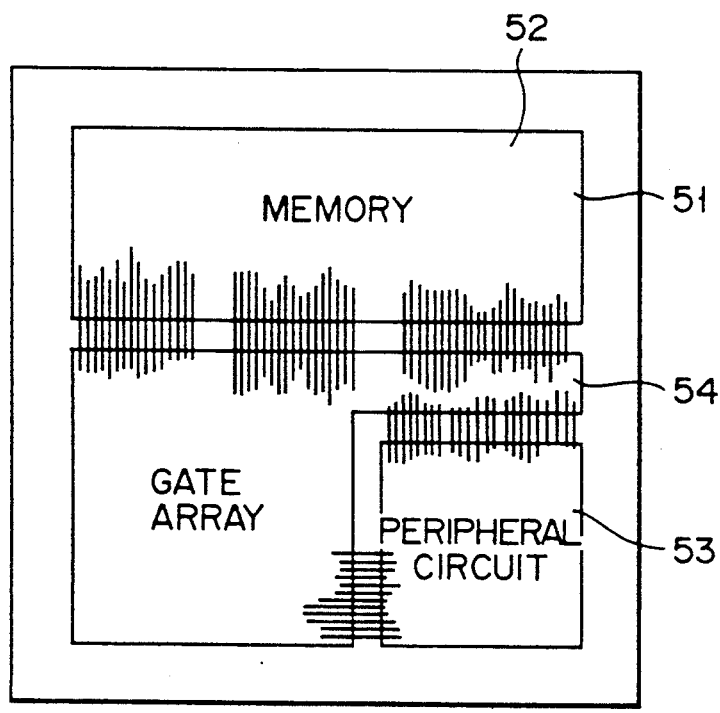
FIG. 6 is a pattern plan view of a product obtained by treating the fourth embodiment in a later wiring process.

FIG. 5 shows a fifth embodiment of the master slice, which incorporates a memory. In a memory chip 51, a memory block 52 whose memory is not changed, and a memory peripheral block 53 having a peripheral circuit are preformed. Metal wires for the memory and peripheral circuit are also preformed of a first wiring layer. A gate array 54 on the chip 51 consists of a basic gate array for a logic gate circuit. As is shown in FIG. 6, the memory block 52, memory peripheral block 53, and gate array 54 are connected in a desired manner by means of a metal layer formed above the blocks and gate array with an insulating layer interposed therebetween, thus being customized.

In the above structure, the base memory blocks have simple wiring, and require a degree of freedom lower than that of base cells forming a gate array. Thus, part of the wiring of transistors in the blocks relating to a memory is completed in the stage of forming the master slice. It is a matter of course to form metal layers for reinforcing a power source line in this stage. Thus, the master slice has high reliability and high designing efficiency.

Then, the method of the invention will be compared with the conventional one. Here, a gate array to which the invention will be applied has a first reinforcing wiring layer for preventing a power source line from electro migration or stress migration, a second metal layer for forming customized circuits, and a third metal layer for connecting the circuits to one another.

The conventional gate array has conventional two or three metal layers. In the conventional gate array having two metal layers, a first metal layer is used to form customized circuits, and a second metal layer is used to connect the circuits to one another. Though this structure is advantageous to shorten the turn around time (TAT), it has low reliability due to its low migration resistance. On the other hand, it takes a long time to design a gate array having the conventional three metal layers so as to increase its integration density, and also to meet with user's request. As regards migration resistance, if the third metal layer is used as reinforcing layer for increasing migration resistance, the required chip area is inevitably increased, though the reliability is enhanced. If the third metal layer is used as signal line, the reliability is lowered though the required chip area is reduced.

The gate array to which the invention is applied, however, is advantageous in that it has reliability higher than the conventional one having three metal layers, and the reinforcing line formed of the first metal layer has a high degree of freedom and a sufficient area. Also, the master slice produced by the method of the invention has a TAT shorter than the conventional one having a third metal layer used as reinforcing layer.

Further, in the master slice incorporating a memory according to the fourth embodiment, the memory is preformed in the slice, which reduces the TAT, and enhances the design accuracy.

As is described above, in the method of the invention, portions requiring high reliability and/or having margin for alteration are preformed in the master slice in a state where partial wiring is made. A wide power source line is formed of the first metal layer, which prevents occurrence of electro or stress migration. Thus, a semiconductor integrated circuit master slice of high reliability is provided, which can be customized with ease.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing master-slice semiconductor integrated circuits to provide customized circuits, in which diffusion layers and gate electrodes, which form transistor elements, are preformed in and on a semiconductor wafer, and in which a plurality of metal wiring layers and interposed insulating layers are also preformed on the semiconductor wafer, the method comprising:

a first wiring process to form a lowermost layer of the metal wiring layers together with the transistor elements on the wafer, said lowermost layer serving as a reinforcing layer for power source wiring to avoid electro migration and stress migration typically occurring on power source lines; and a second wiring process for customization to obtain a particular logic function required by a user by forming metal wiring layers above the metal wiring layer formed in said first wiring process.

2. The method of manufacturing master-slice semiconductor integrated circuits according to claim 1, wherein said reinforcing layer for the power source wiring is formed between the transistor elements.

3. The method of manufacturing master-slice semiconductor integrated circuits according to claim 1, wherein said reinforcing layer for the power source wiring is a broad power line surrounding each of the transistor elements.

4. The method of manufacturing master-slice semiconductor integrated circuits according to claim 1, wherein in the first wiring process, that partial wiring is preformed between some of the transistor elements which is not largely changed.

5. The method of manufacturing master-slice semiconductor integrated circuits according to claim 4, wherein the first wiring process includes the step of forming the power source line.

6. The method of manufacturing master-slice semiconductor integrated circuits according to claim 4, wherein the partial wiring defines a macro cell comprising a memory and a peripheral circuit thereof.

7. A method of manufacturing master-slice semiconductor integrated circuits to provide customized circuits, in which diffusion layers and gate electrodes, which form transistor elements, are preformed in and on a semiconductor wafer, and in which a plurality of metal wiring layers and interposed insulating layers are also preformed on the semiconductor wafer, the method comprising:

a first wiring process for arranging the transistor elements of a first electric conductivity type in a first line and the transistor elements of a second electric conductivity type in a second line and for forming a reinforcing layer only for the power source wiring as a master line between the first and second lines so as to avoid electro migration and stress migration typically occurring on power source lines; and a second wiring process for achieving customization to provide a logic function required by a user by forming the metal wiring layers located above a metal wiring layer formed by said first wiring process.

8. The method of manufacturing master-slice semiconductor integrated circuits according to claim 7, wherein in the first wiring process, that partial wiring is preformed between some of the transistor elements which is not largely changed.

9. The method of manufacturing master-slice semiconductor integrated circuits according to claim 8, wherein the partial wiring defines a macro cell comprising a memory and a peripheral circuit thereof.

10. The method of manufacturing master-slice semiconductor integrated circuits according to claim 7, wherein said reinforcing layer for the power source wiring comprises two wiring systems for supplying two voltages.

11. The method of manufacturing master-slice semiconductor integrated circuits according to claim 7, wherein said reinforcing layer for the power source wiring is formed to surround each of the transistor elements.

* * * * *

UNITED STATES PATENT AND TRADEMARK OFFICE
CERTIFICATE OF CORRECTION

PATENT NO. : 5,171,701
DATED : December 15, 1992
INVENTOR(S) : Masato Nagamatsu

It is certified that error appears in the above-indentified patent and that said Letters Patent is hereby corrected as shown below:

Abstract:
On the Title page, item [57], col. 2, line 8, change "methods" to --method--.

col. 2, line 14, change "inner-most" to --innermost--.

Signed and Sealed this

Fifteenth Day of March, 1994

Attest:

BRUCE LEHMAN

Attesting Officer       Commissioner of Patents and Trademarks